United States Patent
Liu et al.

(10) Patent No.: US 9,647,014 B2
(45) Date of Patent: May 9, 2017

(54) COMPLEMENTARY THIN FILM TRANSISTOR DRIVING BACK PLATE AND PREPARING METHOD THEREOF, AND DISPLAY DEVICE

(71) Applicant: BOE TECHNOLOGY GROUP CO., LTD., Beijing (CN)

(72) Inventors: Xiaodi Liu, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/416,872

(22) PCT Filed: May 27, 2014

(86) PCT No.: PCT/CN2014/078571
§ 371 (c)(1),
(2) Date: Jan. 23, 2015

(87) PCT Pub. No.: WO2015/096382
PCT Pub. Date: Jul. 2, 2015

(65) Prior Publication Data
US 2015/0325605 A1    Nov. 12, 2015

(30) Foreign Application Priority Data
Dec. 24, 2013    (CN) .......................... 2013 1 0723714

(51) Int. Cl.
*H01L 27/12*    (2006.01)
*H01L 29/786*    (2006.01)
(Continued)

(52) U.S. Cl.
CPC .... *H01L 27/1288* (2013.01); *H01L 21/02565* (2013.01); *H01L 21/02631* (2013.01);
(Continued)

(58) Field of Classification Search
CPC .......................... H01L 21/477; H01L 27/1262
See application file for complete search history.

(56) References Cited

U.S. PATENT DOCUMENTS

| 6,940,214 B1 * | 9/2005 | Komiya | H01L 27/3244 313/505 |
| 2008/0119030 A1 * | 5/2008 | Kunii | C23C 16/22 438/479 |
| 2011/0309356 A1 * | 12/2011 | Yabuta | H01L 29/7869 257/43 |

FOREIGN PATENT DOCUMENTS

| CN | 102263134 A | 11/2011 |
| CN | 102341912 A | 2/2012 |
| CN | 103681515 A | 3/2014 |

OTHER PUBLICATIONS

Yabuta, H. et al. (2010) "Sputtering formation of p-type SnO thin-film transistors on glass toward oxide complimentary circuits." American Institute of Physics, 072111-1-072111-3.
(Continued)

*Primary Examiner* — Lex Malsawma
(74) *Attorney, Agent, or Firm* — Collard & Roe, P.C.

(57) ABSTRACT

A complementary thin film transistor driving back plate and a preparing method thereof, and a display device are disclosed. The preparing method comprises: forming a lower electrode (102) on a base substrate (101); sequentially disposing a continuously grown dielectric layer (103), a semiconductor layer (104), and a diffusion protection layer (105); sequentially forming a no-photoresist region (107), an N-type thin film transistor preparation region (108), and a P-type thin film transistor preparation region (109); removing a photoresist layer (114) of the N-type thin film transistor preparation region (108); removing a diffusion protection layer (105) of the N-type thin film transistor preparation region (105); removing a photoresist layer (114) of the
(Continued)

P-type thin film transistor preparation region (109); performing an oxidation treatment to the base substrate (101); disposing a passivation layer (111) on the base substrate (101); and forming an upper electrode (113) on the passivation layer (111).

20 Claims, 7 Drawing Sheets

(51) Int. Cl.

| | | |
|---|---|---|
| *H01L 27/092* | (2006.01) | |
| *H01L 21/477* | (2006.01) | |
| *H01L 21/02* | (2006.01) | |
| *H01L 21/383* | (2006.01) | |
| *H01L 21/8238* | (2006.01) | |

(52) U.S. Cl.
CPC .......... *H01L 21/383* (2013.01); *H01L 21/477* (2013.01); *H01L 21/823807* (2013.01); *H01L 27/092* (2013.01); *H01L 27/127* (2013.01); *H01L 27/1225* (2013.01); *H01L 27/1262* (2013.01); *H01L 29/7869* (2013.01)

(56) References Cited

OTHER PUBLICATIONS

Chinese Office Action of Chinese Application No. 201310723714.0, mailed Aug. 26, 2015 with English translation.

International Search Report and Written Opinion of the International Searching Authority with Notice of Transmittal of the International Search Report and Written Opinion of PCT/CN2014/078571 in Chinese, mailed Sep. 28, 2014.

Second Chinese Office Action of Chinese Application No. 201310723714.0, mailed Feb. 1, 2016 with English translation.

English translation of the International Preliminary Report on Patentability and Written Opinion of the International Searching Authority of PCT/CN2014/078571, issued Jun. 28, 2016.

\* cited by examiner

COMPLEMENTARY THIN FILM TRANSISTOR DRIVING BACK PLATE AND PREPARING METHOD THEREOF, AND DISPLAY DEVICE

CROSS REFERENCE TO RELATED APPLICATIONS

This application is the National Stage of PCT/CN2014/078571 filed on May 27, 2014, which claims priority under 35 U.S.C. §119 of Chinese Application No. 201310723714.0 filed on Dec. 24, 2013, the disclosure of which is incorporated by reference.

TECHNICAL FIELD

Embodiments of the present invention relate to a complementary thin film transistor driving back plate and a preparing method thereof, and a display device.

BACKGROUND

With regard to thin film transistor (TFT) liquid crystal displays, panel manufacturers continue to promote new products. Indium gallium zinc oxide (IGZO) material is gradually applied in display products. However, the IGZO material is mainly used for manufacturing N-type thin film transistors, but its chemical characteristics cannot satisfy the manufacturing requirements of complementary thin film transistor driving back plates. Particularly, when IGZO is used for manufacturing a driving back plate, peripheral driving circuits cannot be produced on an array substrate. Therefore, the manufacture of complementary thin film transistor driving back plates mainly uses low temperature polycrystalline silicon technology, but the preparing processes and devices are relatively complex and the preparing costs are high. Therefore, the manufacture of complementary thin film transistor driving back plates (mainly concentrated in P-type thin film transistors) becomes a research hotspot of big panel manufacturers and scientific research units.

SUMMARY

Some embodiments of the present invention provide a complementary thin film transistor driving back plate and a preparing method thereof, and a display device.

A preparing method provided by at least one embodiment of the present invention comprises: forming a lower electrode on a base substrate; sequentially disposing a continuously grown dielectric layer, a semiconductor layer, and a diffusion protection layer; forming a no-photoresist region, an N-type thin film transistor preparation region, and a P-type thin film transistor preparation region through a plural gray scale optical mask exposing process; removing the photoresist layer in the N-type thin film transistor preparation region through a plasma ashing process; removing a diffusion protection layer of the N-type thin film transistor preparation region; removing the photoresist layer in the P-type thin film transistor preparation region; forming a P-type thin film transistor having a P-type active layer; performing an oxidation treatment to the base substrate; forming an N-type thin film transistor having an N-type active layer; disposing a passivation layer on the base substrate; and fainting an upper electrode on the passivation layer.

At least one embodiment of the present invention provides a complementary thin film transistor driving back plate; the complementary thin film transistor driving back plate comprises a base substrate, a plurality of P-type thin film transistor preparation regions and a plurality of N-type thin film transistor preparation regions disposed on the base substrate, and a no-photoresist region disposed between the P-type thin film transistor preparation regions and the N-type thin film transistor preparation regions.

At least one embodiment of the present invention further provides a display device, comprising a complementary thin film transistor driving back plate as described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not imitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In a preparing process of a complementary thin film transistor driving back plate, it is not easy to define regions of a P-type thin film transistor, an N-type thin film transistor, and a pixel electrode in a complementary thin film transistor driving back plate, prone to cause low yield of the complementary thin film transistor driving back plate, and the manufacturing steps are overly complex and the usage of the optical masks is too much; thus the manufacturing costs are too high.

Figure 1:
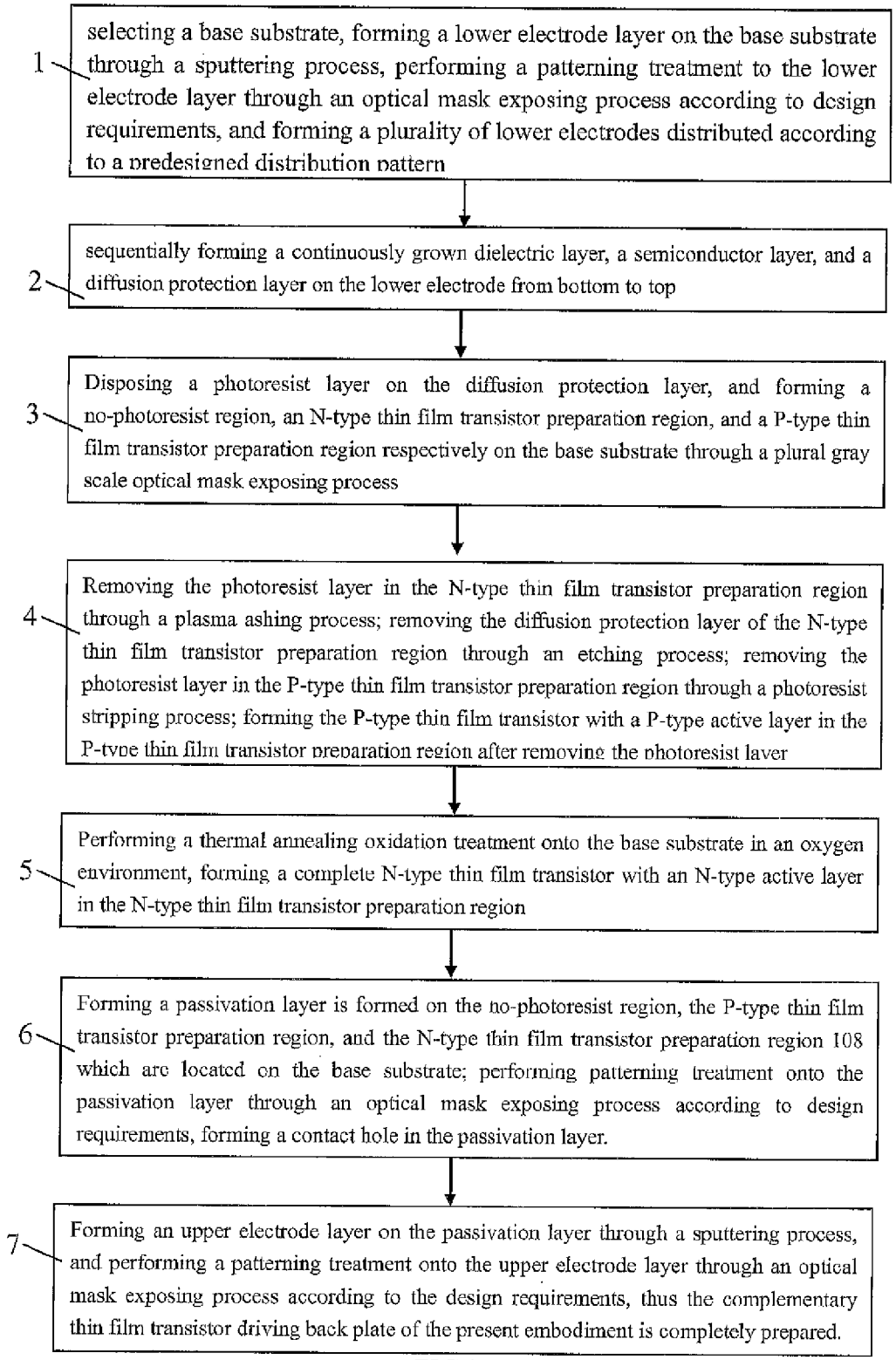
FIG. 1 is a flow schematic diagram of a preparing method of the complementary thin film transistor driving back plate according to an embodiment of the present invention.
Figure 2:
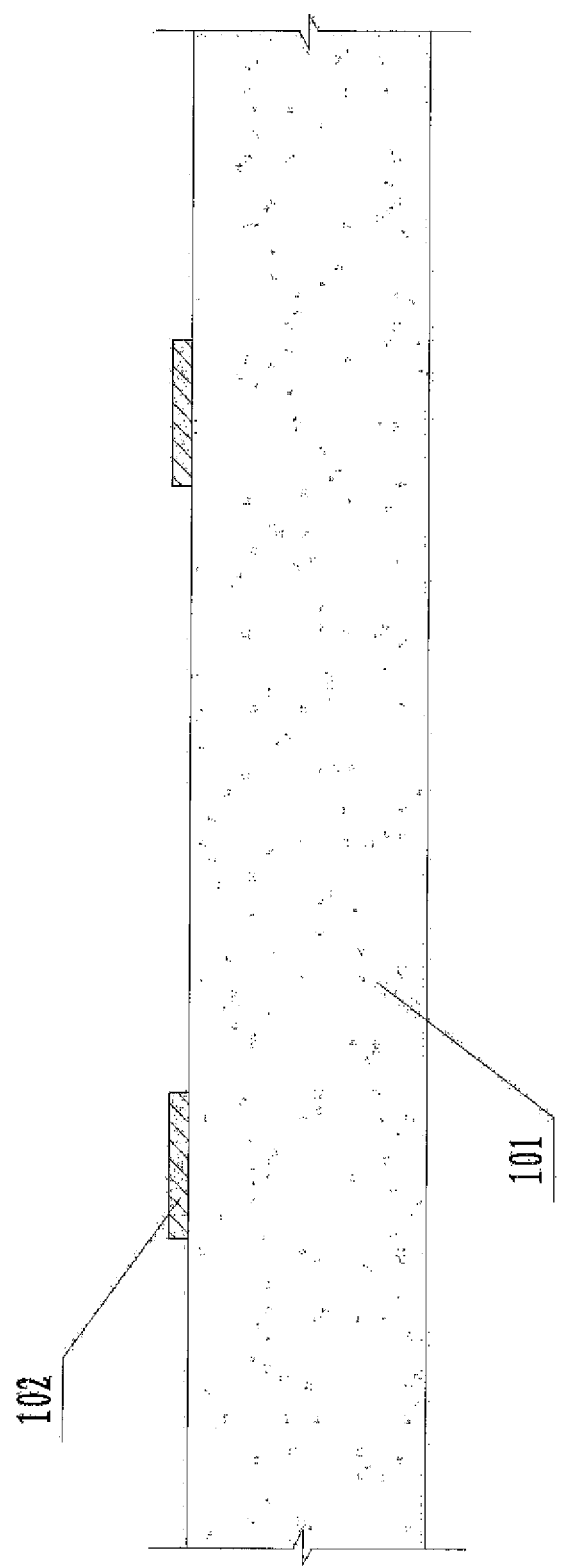
FIG. 2 is a structural schematic diagram of step 1 of the preparing method according to an embodiment of the present invention.

FIG. 1 is a flow schematic diagram of a preparing method of a complementary thin film transistor driving back plate according to at least one embodiment of the present invention; as illustrated by FIG. 1, the method comprises the following steps:

As illustrated by FIG. 2, selecting a base substrate 101, forming a lower electrode layer on the base substrate 101 through a sputtering process, performing a patterning treatment to the lower electrode layer through an optical mask exposing process according to design requirements, and forming a plurality of lower electrodes 102 distributed according to a predesigned distribution pattern are conducted. The base substrate in the present embodiment may comprise a common material such as glass or silicon, but the selected material is not limited to the two materials; and materials whichever have a good light transmission property and a certain degree of hardness may be manufactured as a base substrate. The lower electrode according to the embodiment may be any one or a random combination selected from a group consisting of Mo, Al/Nd, Al/Nd/Mo, Mo/Al/Nd/Mo, or Au/Ti; each lower electrode 102 formed on the base substrate 101 will be used as a gate electrode of a P-type thin film transistor or an N-type thin film transistor.

Figure 3:
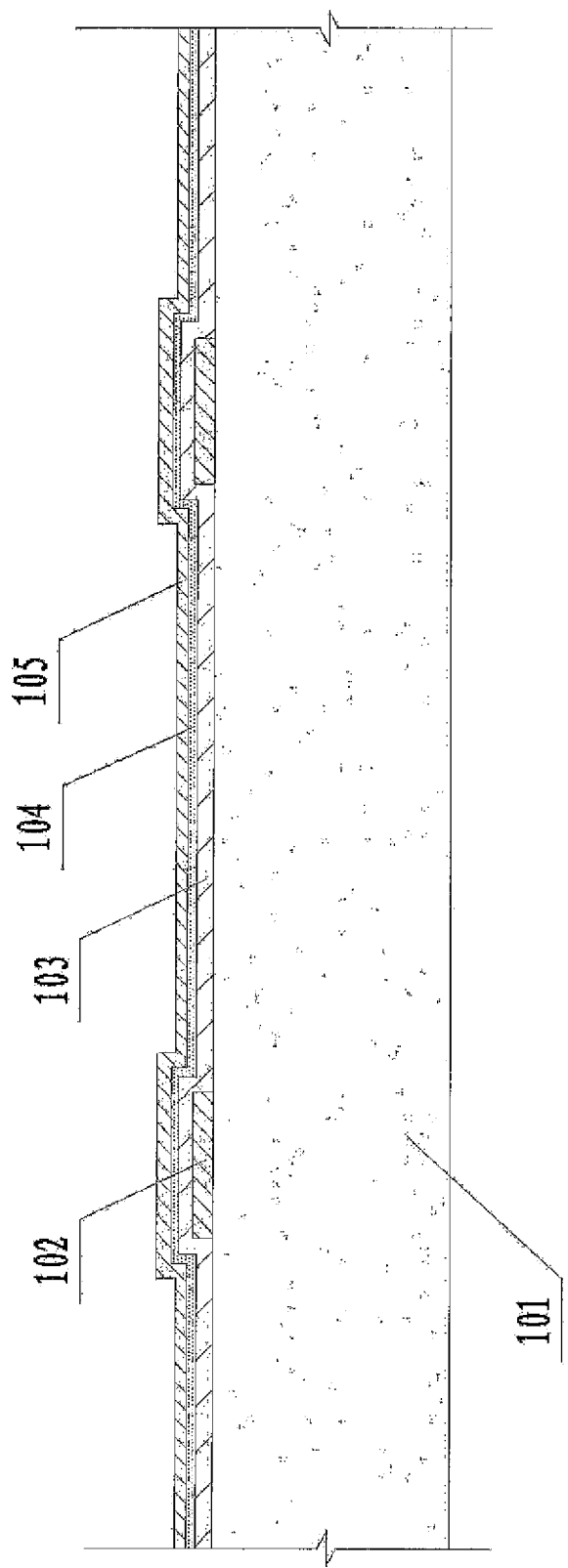
FIG. 3 is a structural schematic diagram of step 2 of the preparing method according to an embodiment of the present invention.

As illustrated by FIG. 3, a continuously grown dielectric layer 103, a semiconductor layer 104, and a diffusion protection layer 105 are sequentially formed on the lower electrode 102 from bottom to top. In the present embodiment, the continuously grown dielectric layer 103 or the diffusion protection layer 105 may be a single layer or multiple layers. For example, the continuously grown dielectric layer 103 covers all the lower electrodes 102 disposed on the base substrate 101, and the semiconductor layer 104 and the diffusion protection layer 105 are sequentially disposed on the continuously grown dielectric layer 103. The material of the semiconductor layer 104 is, for example, SnO (stannous oxide) material. In the present embodiment, the semiconductor layer 104 is manufactured by using one of sputtering process, sol-gel process, vacuum evaporation process, and spraying process. SnO has characteristics of high cavity mobility and stable structure and physical property, and satisfies the characteristics of P-type thin film transistors.

The continuously grown dielectric layer 103 in an embodiment of the present invention may be formed by using one of thermal growth process, atmospheric pressure chemical vapor deposition process, low pressure chemical vapor deposition process, plasma enhanced chemical vapor deposition process, and sputtering process. The continuously grown dielectric layer 103 is one or a combination of $SiO_x$ and $SiN_x$.

The diffusion protection layer 105 in an embodiment of the present invention may be formed by using one of thermal growth process, atmospheric pressure chemical vapor deposition process, low pressure chemical vapor deposition process, plasma enhanced chemical vapor deposition process, and sputtering process. The diffusion protection layer 105 is one or a combination of $SiO_x$ and $SiN_x$.

Figure 4:
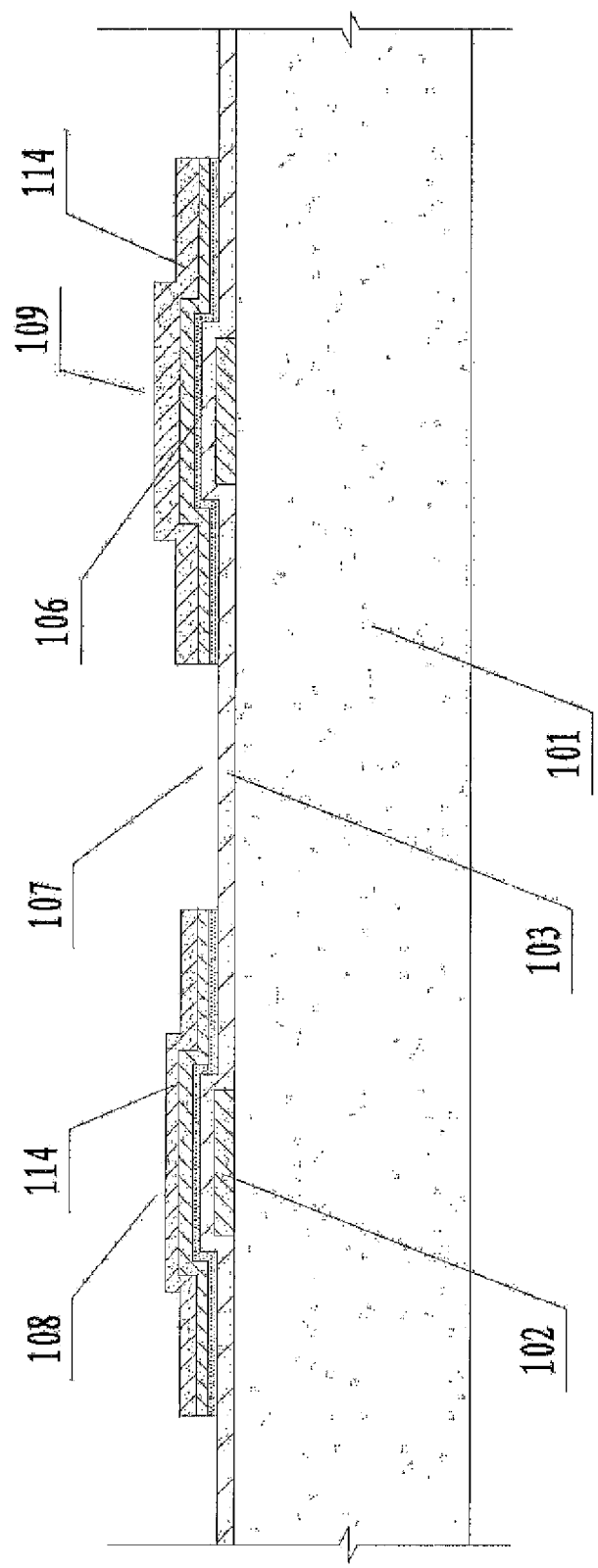
FIG. 4 is a structural schematic diagram of step 3 of the preparing method according to an embodiment of the present invention.

As illustrated by FIG. 4, a photoresist layer 114 is disposed on the diffusion protection layer 105; a no-photoresist region 107, an N-type thin film transistor preparation region 108, and a P-type thin film transistor preparation region 109 are separately formed on the base substrate, for example, through a plural gray scale optical mask exposing process. For example, in the present embodiment, the no-photoresist region 107, the N-type thin film transistor preparation region 108, and the P-type thin film transistor preparation region 109 are separately formed on the base substrate through a plural gray scale optical mask exposing process.

In an embodiment of the present application, exposure, development, and etching are performed through a plural gray scale optical mask exposing process according to the design position of the no-photoresist region 107 located on the base substrate 101 to remove the photoresist layer 114, the diffusion protection layer 105, and the semiconductor layer 104 at the design position of the no-photoresist region 107 so as to form a no-photoresist region 107. Correspondingly, a side of the no-photoresist region 107 is the design position of the P-type thin film transistor preparation region 109, the other side is the design position of the N-type thin film transistor preparation region 108, and the no-photoresist region 107 becomes an isolation region between the two transistors. For example, according to the design position of the N-type thin film transistor preparation region 108 and the design position of the P-type thin film transistor preparation region 109, for example, a double tone mask plate may be used to conduct the plural gray scale optical mask exposing process, and the double tone mask plate does not shield the no-photoresist region 107. On the another aspect, after performing partial exposure, development, and stripping of photoresist with respect to the design position of the N-type thin film transistor preparation region through a semi-transparent film on the double tone mask plate, the photoresist layer 114 thereon becomes thinner, and an N-type thin film transistor preparation region 108 is formed. Meanwhile, the P-type thin film transistor preparation region 109 is completely shielded by the double tone mask plate, so that the photoresist layer of the P-type thin film transistor preparation region 109 is not exposed, developed, or stripped, its thickness remains unchanged, and a P-type thin film transistor preparation region 109 is formed.

The no-photoresist region 107 in the present embodiment is used to manufacture an isolation region between thin film transistors; the design of forming the isolation region may define the N-type thin film transistor preparation region 108 and the P-type thin film transistor preparation region 109 which are separately formed at the two sides of the isolation region. The N-type thin film transistor preparation region 108 is used as a manufacturing region for an N-type thin film transistor, and the P-type thin film transistor preparation region 109 is used as a manufacturing region for a P-type thin film transistor.

As illustrated by FIG. 4, the photoresist layer 114 in the N-type thin film transistor preparation region 108 is removed through a plasma ashing process; in an embodiment of the present invention, the photoresist layer 114 in the P-type thin film transistor preparation region 109 after the plasma ashing process correspondingly becomes thinner. Later, the diffusion protection layer 105 of the N-type thin film transistor preparation region 108 is removed through an etching process. Then, the photoresist layer 114 in the P-type thin film transistor preparation region 109 is removed through a photoresist stripping process. The P-type thin film transistor with a P-type active layer 106 is formed in the P-type thin film transistor preparation region 109 after removing the photoresist layer 114.

Figure 5:
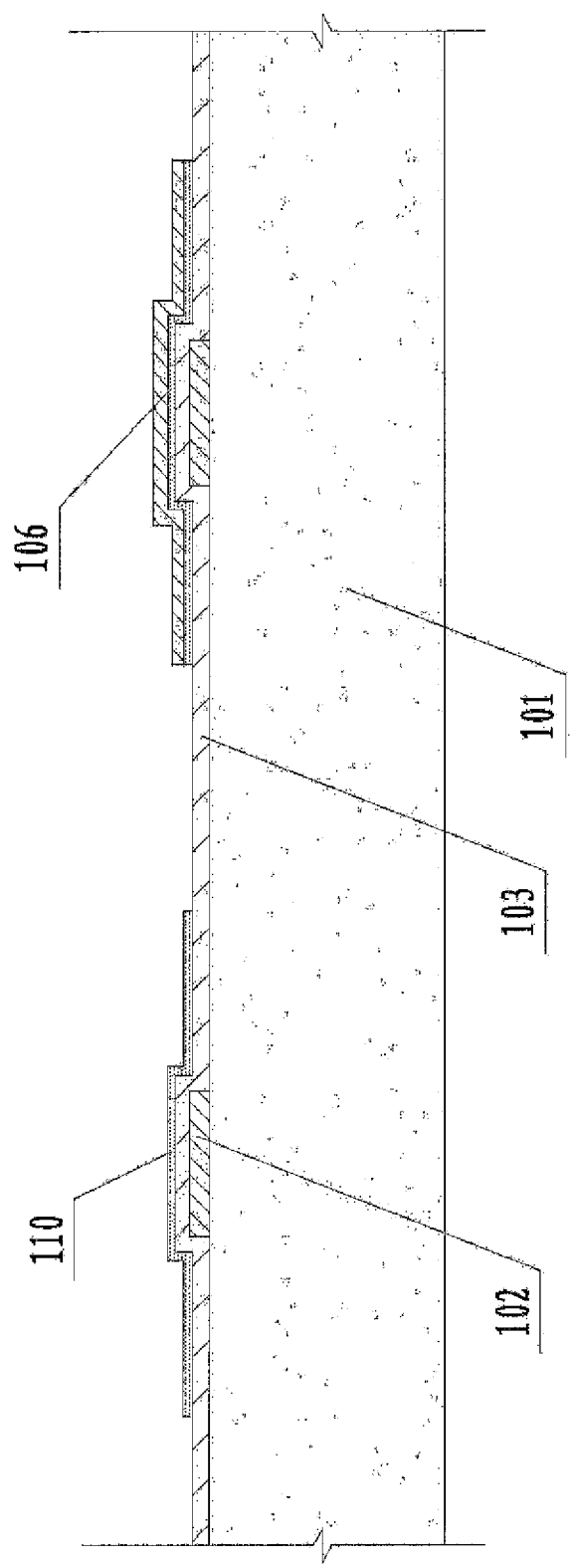
FIG. 5 is a structural schematic diagram of step 4 of the preparing method according to an embodiment of the present invention.

As illustrated by FIG. 5, a thermal annealing oxidation treatment is preformed onto the base substrate in an oxygen environment, forming a complete N-type thin film transistor with an N-type active layer 110 in the N-type thin film transistor preparation region 108. In an embodiment of the present invention, during the oxidation treatment process, the P-type thin film transistor located in the P-type thin film transistor preparation region 109 is not subjected to the oxidation treatment because of the protection of the diffusion protection layer 105, and the P-type active layer 106 in the P-type thin film transistor formed through a plural gray scale optical mask exposing process still remains SnO which satisfies the characteristics of the P-type thin film transistor. However, the material of the semiconductor layer 104 in the N-type thin film transistor preparation region 108 after the oxidation treatment is oxidized from SnO to $SnO_x$, wherein $1<x<2$; chemical characteristics of the semiconductor layer 104 in the N-type thin film transistor preparation region 108 are changed and satisfy the characteristics of N-type thin film transistor, the semiconductor layer 104 is used to manufacture an N-type active layer 110 connected with the upper electrode 113 in the N-type thin film transistor; therefore, an N-type thin film transistor is formed in the N-type thin film transistor preparation region 108.

Figure 6:
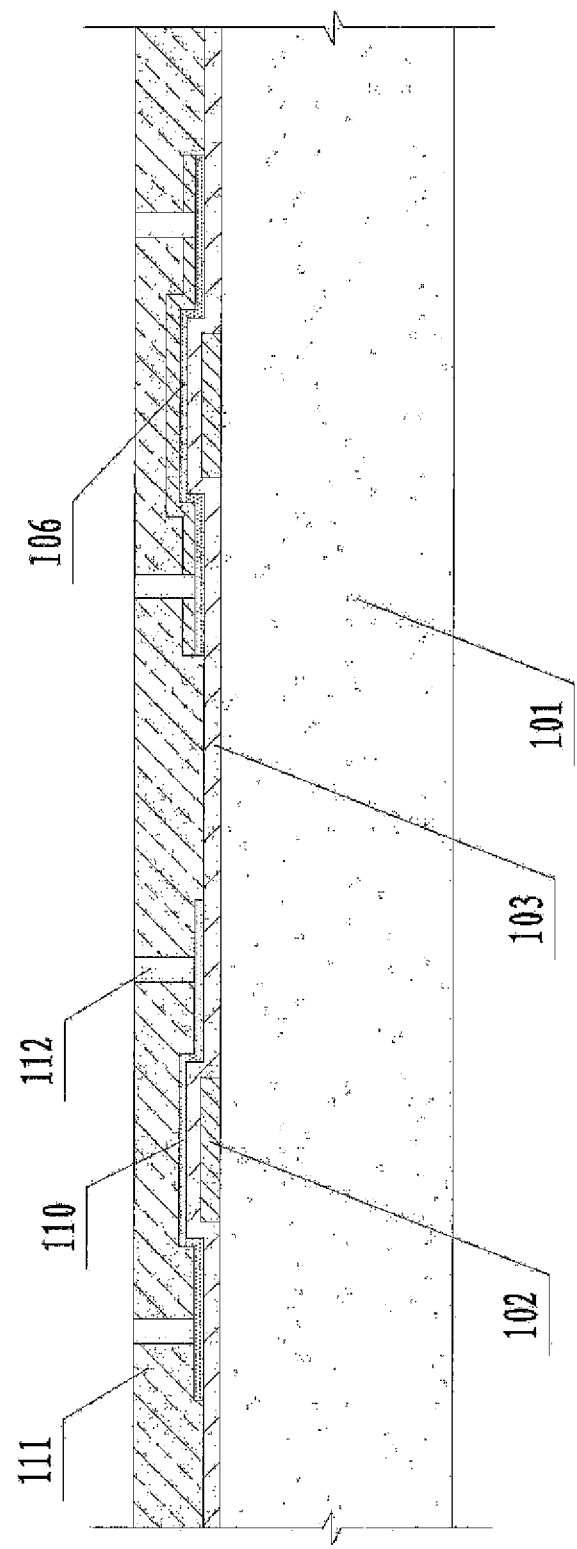
FIG. 6 is a structural schematic diagram of step 5 of the preparing method according to an embodiment of the present invention.

As illustrated by FIG. 6, a passivation layer 111 is formed on the no-photoresist region 107, the P-type thin film transistor preparation region 109, and the N-type thin film transistor preparation region 108 which are located on the base substrate 101. The passivation layer 111 completely covers the three regions, fills in the no-photoresist region 107 to make the no-photoresist region 107, the P-type thin film transistor, and the N-type thin film transistor have the same height, and plays a role for isolation and protection of covered devices. The passivation layer 111 is usually formed of an insulating material. A patterning treatment is performed onto the passivation layer 111 through an optical mask exposing process according to design requirements, forming a contact hole 112 in the passivation layer 111; the contact hole 112 is separately disposed on the passivation layer 111 corresponding to the P-type active layer or the N-type active layer at the two sides of the P-type thin film transistor preparation region 109 or the N-type thin film transistor preparation region 108. For example, as illustrated by FIG. 6, the contact hole 112 located in the P-type thin film transistor preparation region goes through the diffusion protection layer 105 at the two sides of the P-type thin film transistor preparation region 109, is directly connected to the P-type active layer 106; the passivation layer 111 in the present embodiment may be a single layer or plural layers. The passivation layer 111 is formed by, for example, using one of thermal growth process, atmospheric pressure chemical vapor deposition process, low pressure chemical vapor deposition process, plasma enhanced chemical vapor deposition process, and sputtering process. The passivation layer 111 is one or a combination of $SiO_x$ and $SiN_x$.

Figure 7:
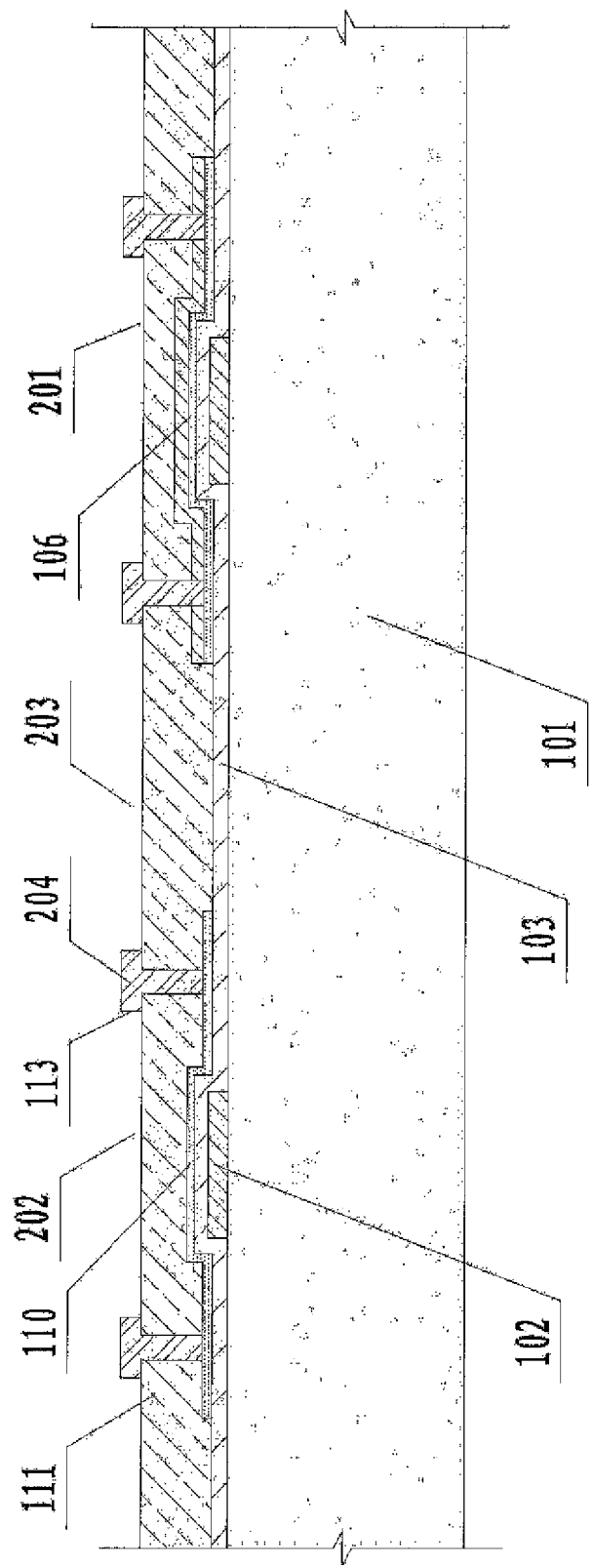
FIG. 7 is a structural schematic diagram of a complementary thin film transistor driving back plate according to an embodiment of the present invention.

As illustrated by FIG. 7, an upper electrode layer is formed on the passivation layer 111 through a sputtering process, and a patterning treatment is performed onto the upper electrode layer through an optical mask exposing process according to the design requirements, forming a plurality of upper electrodes 113 distributed according to a predesigned distribution pattern. A lower portion of the upper electrode 113 extends into the contact hole to be connected and electrically conducted with the P-type active layer 106 or the N-type active layer 110. The upper electrode 113 in the present embodiment is any one or a random combination of materials consisting of Mo, Al/Nd, Al/Nd/Mo, Mo/Al/Nd/Mo, or Au/Ti. For example, the complementary thin film transistor driving back plate obtained through the above steps may be further treated through an annealing process in a vacuum environment, nitrogen gas environment, or oxygen gas environment; an annealing temperature is controlled within a range of 120~450□, an annealing time period is controlled within a range of 0.5~2 hours. Thus, the complementary thin film transistor driving back plate of the present embodiment is completely prepared.

A preparing method of the complementary thin film transistor driving back plate provided by at least one embodiment of the present invention needs to use a double tone mask plate only one time to conduct partial exposure and development during the plural gray scale optical mask exposing process, and the process can simultaneously define and form an N-type thin film transistor preparation region and a P-type thin film transistor preparation region. As seen from above, the manufacturing regions for a P-type thin film transistor, an N-type thin film transistor, and a pixel electrode can be clearly defined, providing a reliable safeguard for the manufacture of various devices subsequently. In this way, the problem of cross interference between the P-type thin film transistor and the N-type thin film transistor caused by unclear definition of the manufacturing regions for the devices in the complementary thin film transistor driving back plate manufacturing process is efficiently solved. Therefore, at least one embodiment of the present invention can efficiently overcome a thus resulted problem of low yield of products, and the manufacturing costs are efficiently reduced. Meanwhile, the diffusion protection layer of the P-type thin film transistor preparation region is used as a mask plate of the P-type active layer in the thermal annealing oxidation treatment, which can save a step of manufacturing the P-type active layer with one optical mask exposing process. Therefore, an embodiment of the present invention can simplify the preparing processes, improve the yield of products, and efficiently reduce the manufacturing costs.

FIG. 7 is a structural schematic diagram of a complementary thin film transistor driving back plate provided by an embodiment of the present application, the complementary thin film transistor driving back plate provided by the present embodiment is manufactured through the above described preparing method, and its structure is provided as follows in detail.

As illustrated by FIG. 7, the complementary thin film transistor driving back plate of the embodiment of the present invention comprises: a base substrate 101, a plurality of P-type thin film transistor preparation regions 201 and a plurality of N-type thin film transistor preparation regions 202 disposed on the base substrate 101, and a no-photoresist region 203 disposed between the P-type thin film transistor preparation regions 201 and the N-type thin film transistor preparation regions 202.

The P-type thin film transistor preparation region 201 is sequentially provided with a lower electrode 102, a continuously grown dielectric layer 103, a P-type active layer 106, a diffusion protection layer 105, and a passivation layer 111 form bottom to top; two sides of the P-type active layer 106 are provided with an upper electrode 113 contacted with the P-type active layer 106, the upper electrode 113 extends into a contact hole 112 in the passivation layer 111, and an electrode connecting head 204 is disposed thereon; the P-type active layer 106 and the lower electrode constitute a P-type thin film transistor.

The N-type thin film transistor preparation region 202 is sequentially provided with a lower electrode 102, a continuously grown dielectric layer 103, an N-type active layer 110, and a passivation layer 111 form bottom to top; two sides of the N-type active layer 110 are provided with an upper electrode 113 contacted with the N-type active layer 110, the upper electrode 113 extends into a contact hole 112 in the passivation layer 111, and an electrode connecting head 204 is disposed thereon; the N-type active layer 110 and the lower electrode 102 constitute an N-type thin film transistor.

The no-photoresist region 203 is sequentially provided with a continuously grown dielectric layer 103 and a passivation layer 111 from bottom to top; the two ends of the continuously grown dielectric layer 103 are respectively connected with the continuously grown dielectric layers 103 in the P-type thin film transistor preparation region 201 and the N-type thin film transistor preparation region 202, the passivation layer 111 of the no-photoresist region 203 is located between one of the upper electrodes 113 in the P-type thin film transistor preparation region 201 and another upper electrode 113 in the N-type thin film transistor preparation region 202; a side of the passivation layer 111 in the no-photoresist region 203 covers a side of the corresponding N-type active layer 110 on the continuously grown dielectric layer 103, the other side of the passivation layer 111 covers the diffusion protection layer 105 together with the P-type active layer 106 of a side of the corresponding P-type thin film transistor preparation region 201 on the continuously grown dielectric layer 103.

In the present embodiment, the no-photoresist region 203 may be formed with a pixel electrode (not shown in the drawings); according to different kinds of applications, the pixel electrode may be an anode of an active matrix organic light emitting diode (OLED) display or may be a pixel electrode of an active matrix liquid crystal display (TFT-LCD); the pixel electrode is respectively connected with the P-type active layer 106 and the N-type active layer 110 by connection to the electrode connecting heads 204 of the upper electrodes 113.

At least one embodiment of the present invention further provides a display device, which comprises the complementary thin film transistor driving back plate as described above; an example of the display device comprises an active matrix organic light emitting diode display or an active matrix liquid crystal display.

In an embodiment, when the display device is an active matrix organic light emitting diode display, the complementary thin film transistor driving back plate is further provided with an organic light emitting layer. In an embodiment, when the display device is an active matrix liquid crystal display, the upper and lower sides of the complementary thin film transistor driving back plate are respectively provided a liquid crystal panel and a backlight module. The specific structures of the organic light emitting layer, the liquid crystal panel, and the backlight module are not repeated herein.

What are described above is related to the illustrative embodiments of the disclosure only and not limitative to the scope of the disclosure; the scopes of the disclosure are defined by the accompanying claims.

The present application requests a priority of a Chinese patent application with the application number of 201310723714.0, submitted on Dec. 24, 2013; the Chinese patent application is entirely incorporated herein by reference as a part of the present application.

The invention claimed is:

1. A preparing method of a complementary thin film transistor driving back plate, comprising:
    forming a lower electrode on a base substrate;
    sequentially disposing a continuously grown dielectric layer, a semiconductor layer, and a diffusion protection layer;
    forming a no-photoresist region, an N-type thin film transistor preparation region, and a P-type thin film transistor preparation region;
    removing a photoresist layer of the N-type thin film transistor preparation region while remaining a photoresist layer of the P-type thin film transistor preparation region;
    removing the diffusion protection layer of the N-type thin film transistor preparation region while remaining the diffusion protection layer of the P-type thin film transistor preparation region;
    removing the photoresist layer in the P-type thin film transistor preparation region, and forming a P-type thin film transistor with a P-type active layer;
    performing an oxidation treatment to the base substrate, and forming an N-type thin film transistor with an N-type active layer;
    disposing a passivation layer on the base substrate; and
    forming an upper electrode on the passivation layer.

2. The preparing method of a complementary thin film transistor driving back plate according to claim 1, further comprising:
    performing an annealing treatment to the prepared complementary thin film transistor driving back plate.

3. The preparing method of a complementary thin film transistor driving back plate according to claim 2, wherein an annealing temperature is within a range of 120~450° C., and an annealing time period is within a range of 0.5~2.0 h.

4. The preparing method of a complementary thin film transistor driving back plate according to claim 3, wherein a material of the semiconductor layer is SnO material.

5. The preparing method of a complementary thin film transistor driving back plate according to claim 4, wherein the semiconductor layer in the N-type thin film transistor preparation region after the oxidation treatment, a material of which is oxidized from SnO to $SnO_x$, where $1<x<2$, is used as the N-type active layer of the N-type thin film transistor; and during the process of the oxidation treatment, the P-type active layer of the P-type thin film transistor is not subjected to the oxidation treatment because of protection of the diffusion protection layer.

6. The preparing method of a complementary thin film transistor driving back plate according to claim 3, wherein the semiconductor layer is formed by using one of sputtering process, sol-gel process, vacuum evaporation process, and spraying process.

7. The preparing method of a complementary thin film transistor driving back plate according to claim 3, wherein performing a patterning treatment to an upper electrode layer to form a plurality of upper electrodes.

8. The preparing method of a complementary thin film transistor driving back plate according to claim 2, wherein a material of the semiconductor layer is SnO material.

9. The preparing method of a complementary thin film transistor driving back plate according to claim 8, wherein the semiconductor layer in the N-type thin film transistor preparation region after the oxidation treatment, a material of which is oxidized from SnO to $SnO_x$, where $1<x<2$, is used as the N-type active layer of the N-type thin film transistor; and during the process of the oxidation treatment, the P-type active layer of the P-type thin film transistor is not subjected to the oxidation treatment because of protection of the diffusion protection layer.

10. The preparing method of a complementary thin film transistor driving back plate according to claim 2, wherein the semiconductor layer is formed by using one of sputtering process, sol-gel process, vacuum evaporation process, and spraying process.

11. The preparing method of a complementary thin film transistor driving back plate according to claim 2, wherein performing a patterning treatment to an upper electrode layer to form a plurality of upper electrodes.

12. The preparing method of a complementary thin film transistor driving back plate according to claim 1, wherein a material of the semiconductor layer is SnO material.

13. The preparing method of a complementary thin film transistor driving back plate according to claim 12, wherein the semiconductor layer in the N-type thin film transistor preparation region after the oxidation treatment, a material of which is oxidized from SnO to $SnO_x$, where $1<x<2$, is used as the N-type active layer of the N-type thin film transistor; and during the process of the oxidation treatment, the P-type active layer of the P-type thin film transistor is not subjected to the oxidation treatment because of protection of the diffusion protection layer.

14. The preparing method of a complementary thin film transistor driving back plate according to claim 12, wherein the semiconductor layer is formed by using one of sputtering process, sol-gel process, vacuum evaporation process, and spraying process.

15. The preparing method of a complementary thin film transistor driving back plate according to claim 12, wherein performing a patterning treatment to an upper electrode layer to form a plurality of upper electrodes.

16. The preparing method of a complementary thin film transistor driving back plate according to claim 1, wherein the semiconductor layer is formed by using one of sputtering process, sol-gel process, vacuum evaporation process, and spraying process.

17. The preparing method of a complementary thin film transistor driving back plate according to claim 16, wherein performing a patterning treatment to an upper electrode layer to form a plurality of upper electrodes.

18. The preparing method of a complementary thin film transistor driving back plate according to claim 1, wherein performing a patterning treatment to an upper electrode layer to form a plurality of upper electrodes.

19. A complementary thin film transistor driving back plate, comprising:
a base substrate;
a plurality of P-type thin film transistor preparation regions and a plurality of N-type thin film transistor preparation regions disposed on the base substrate, and
a no-photoresist region disposed between the P-type thin film transistor preparation region and the N-type thin film transistor preparation region;
wherein each of the P-type thin film transistor preparation regions is sequentially provided with a first lower electrode, a continuously grown dielectric layer, a P-type active layer, a diffusion protection layer, and a passivation layer from bottom to top; two sides of the P-type active layer are each provided with a first upper electrode contacted with the P-type active layer, the first upper electrode extends through a first contact hole in the passivation layer, and a first electrode connecting head is disposed on the first upper electrode; and the P-type active layer and the first lower electrode constitute a P-type thin film transistor; and
each of the N-type thin film transistor preparation regions is sequentially provided with a second lower electrode, the continuously grown dielectric layer, an N-type active layer, and the passivation layer from bottom to top; two sides of the N-type active layer are each provided with a second upper electrode contacted with the N-type active layer, the second upper electrode extends through a second contact hole in the passivation layer, the passivation layer directly contacts an upper surface of the N-type active layer, and a second electrode connecting head is disposed on the second upper electrode; and the N-type active layer and the second lower electrode constitute an N-type thin film transistor.

20. A display device, which comprises the complementary thin film transistor driving back plate according to claim 19.

* * * * *